United States Patent [19]
Ando et al.

[11] Patent Number: 5,166,529
[45] Date of Patent: Nov. 24, 1992

[54] ELECTRON BEAM LITHOGRAPHY SYSTEM

[75] Inventors: Hiroyoshi Ando, Katsuta; Genya Matsuoka, Oume; Hiroyuki Takahashi, Yokohoma; Hidenori Yamaguchi, Kokubunji; Teruo Iwasaki, Hinode, all of Japan

[73] Assignee: Hitachi, Ltd., Tokyo, Japan

[21] Appl. No.: 801,353

[22] Filed: Dec. 2, 1991

[30] Foreign Application Priority Data

Dec. 1, 1990 [JP] Japan .................. 2-400009

[51] Int. Cl.$^5$ .................. H01J 27/30
[52] U.S. Cl. .................. 250/491.1; 250/492.2
[58] Field of Search .................. 250/491.1, 492.2

[56] References Cited

U.S. PATENT DOCUMENTS

| | | | |
|---|---|---|---|
| 4,334,139 | 6/1982 | Wittekock et al. | 250/491.1 |
| 4,468,565 | 8/1984 | Blair et al. | 250/491.1 |
| 4,821,196 | 4/1989 | Coppolpy et al. | 250/491.1 |
| 5,025,165 | 6/1991 | Chen et al. | 250/491.1 |
| 5,074,667 | 12/1991 | Miyatake | 250/491.1 |
| 5,094,536 | 3/1992 | MacDonald et al. | 250/491.1 |

FOREIGN PATENT DOCUMENTS

| | | |
|---|---|---|
| 53-139768 | 10/1977 | Japan . |
| 1-157423 | 10/1989 | Japan . |
| 1-167733 | 11/1989 | Japan . |

*Primary Examiner*—Bruce C. Anderson
*Attorney, Agent, or Firm*—Antonelli, Terry, Stout & Kraus

[57] ABSTRACT

An electron beam lithography apparatus, comprising an electron beam source for irradiating an electron beam on a specimen surface, a deflectional controller of the electron beam, a focal controller of the electron beam on the specimen surface, a light source which irradiates two monochromatic lights on the surface having wavelengths which are different a half thereof each other, a signal processor for obtaining correction values in a height direction of the beam based on the reflected lights from the surface, and a means for adjusting the focal controller according to the correction values in the height direction. As the wavelengths of the two monochromatic lights on the surface are different in a half wavelength each other, an interference caused by a photo-resist on the specimen is prevented.

15 Claims, 4 Drawing Sheets

ELECTRON BEAM LITHOGRAPHY SYSTEM

BACKGROUND OF THE INVENTION

The present invention relates to an electron beam lithography system having a device for measuring a height of an upper surface of a specimen such as a semiconductor or mask f an electron beam in horizontal and height directions.

In the general electron beam lithography system having the height measuring means, the height of the upper surface of the specimen is usually measured by detecting a reflected light from the upper surface by a position sensor.

The Japanese Utility Model Laid-open No. 52-139768(1977), No.1-157423(1989) and No.1-167733(1989) are cited as examples of such devices.

Using exposing a pattern of a mask or a reticle on the upper surface with the apparatus stated above ,there is not a particular problem. But, in a directly exposure system, electron beam lithography system which is used in directly exposing a various patterns on the upper surface of the specimen, a serious problems arise as follows;

(1) The directly exposed patterns are usually so fine that it is needed to measure the height of the upper surface in a high accuracy in order to expose the pattern accurately.

(2) One of the light reflected from a photo-resist coated on the specimen is interfered by the other light reflected from the specimen, and the reflected light on the detector becomes so feeble that the measuring accuracy becomes low.

(3) In the directly exposure system, overlapping exposure of another pattern are repetitively performed on the pattern of the specimen which is already exposed. The reflected light is scattered by the under pattern of the specimen and it becomes impossible to detect the fully strong light.

Summary of the Invention

The present invention has been accomplished to overcome the above-mentioned problem of the conventional technique.

An object of present invention is to provide an electron beam lithography system which is improved so as to expose the various patterns on the upper surface of the specimen with a high accuracy.

Another object of the present invention is to measure the height of the upper surface without being disturbed by the interference of the reflected light caused of the photo-resist coated on the specimen such as a semiconductor wafer or by the circuit pattern on the surface.

In order to attain the above-mentioned objects in the present invention, a light source which irradiates at least two lights on the upper surface of the specimen which has different wavelengths by a half thereof each other is provided. The two lights are selectively detected so as to be measured the height of the specimen and correct the focus or the deflective value of the electron beam.

Furthermore, two sets of light sources which are disposed in a different angle or desirably in perpendicular angle around a vertical axis on the upper surface of the specimen are provided in order to avoid an influence of the light reflected from the upper surfaces which is scattered by the electronic circuit patterns etc.

DETAILED DESCRIPTION OF THE PREFERRED EMBODIMENTS

Figure 3:
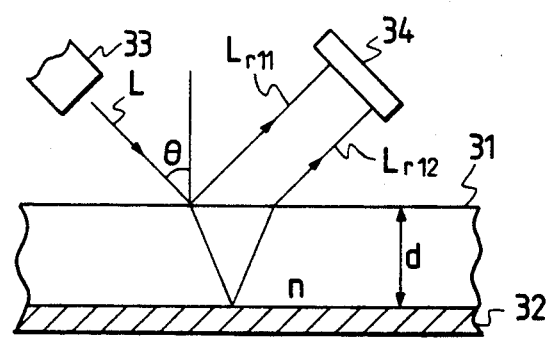
FIG. 3 is a diagrammatic view of the reflected light from an upper surface of the specimen and a photo-resist thereon for explaining an influence of an interference between the lights reflected from the specimen upper surface of the specimen and a photo-resist coated thereon in the present invention.

In FIG. 3A, a light L is irradiated from a light source 33 on a photo-resist 31 coated on the wafer specimen 32 as shown, and a disturbance caused by the interference between the reflected lights $L_{r11}$ and $L_{r12}$ detected by a detector 34 is arisen by following condition;

$$2d\sqrt{n^2-\sin^2\theta}=(2m+1)\lambda/2 (m=1, 2, \text{---}) \quad (1)$$

where d is a thickness of the photo-resist 31, n is a refractive index, $\lambda$ is a wavelength of the light L and $\theta$ is an incidence angle of the light L.

At this time, if a certain wavelength $\lambda_1$ satisfies the above equation (1) under a certain condition of d, n and $\theta$, the lights $L_{r11} L_{r12}$ are interfered each other and the strength of the light detected by the detector becomes very feeble. Under the same condition of d, n and $\theta$, if the light L having the wavelength $\lambda_2$ which is different by a half of the wavelength is incident on the photo-resist 31, the interference of the reflected light L does not appear absolutely.

Therefore in the present invention, mixed lights having two kinds of the wavelengths $\lambda_1$ and $\lambda_2$ which are different by a half of the wavelengths $\lambda_1$ or $\lambda_2$ each other are projected on the photo-resist and at least any one of the mixed lights is not interfered absolutely.

Figure 2A:
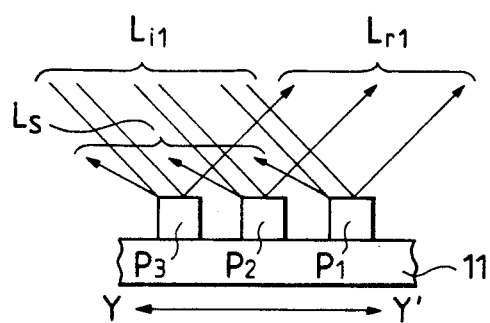
FIG. 2A and FIG. 2B are diagrammatic views of the reflected light from an upper surface of the specimen for explaining an influence of scattered light in the present invention.

Furthermore, when heights of plural patterns $P_1$, $P_2$, $P_3$ formed on a wafer 11 respectively shaped as straight lines disposed along X direction are measured and light $L_{i1}$ utilized for detecting the heights is irradiated on the patterns $P_1$, $P_2$, $P_3$ from the Y direction shown as Y - Y' in FIG. 2A, reflected light $L_s$ is scattered at long and many edges of the patterns $P_1$, $P_2$, $P_3$. Therefore, the strength of light $L_{r1}$ reflected from upper portion of the patterns $P_1$, $P_2$, $P_3$ reflected becomes feeble.

Figure 2B:
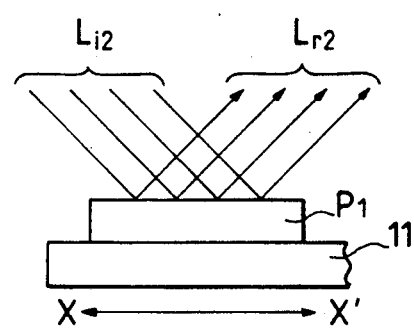

On the contrary, if light $L_{i2}$, utilized for detecting the heights is irradiated on the patterns $P_1$, $P_2$, $P_3$ from the X direction shown as X - X' in FIG. 2B, scattered light $L_s$ does not arise and reflected light $L_{r2}$ is fully strong.

Therefore, in an embodiment of the present invention, at least two sets of light sources are provided and the light sources irradiate the lights for respectively detecting the heights on the patterns $P_1$, $P_2$, $P_3$ from the X direction and the Y direction at the same time.

The embodiment of the present invention will be explained in detail using figures.

Figure 4:
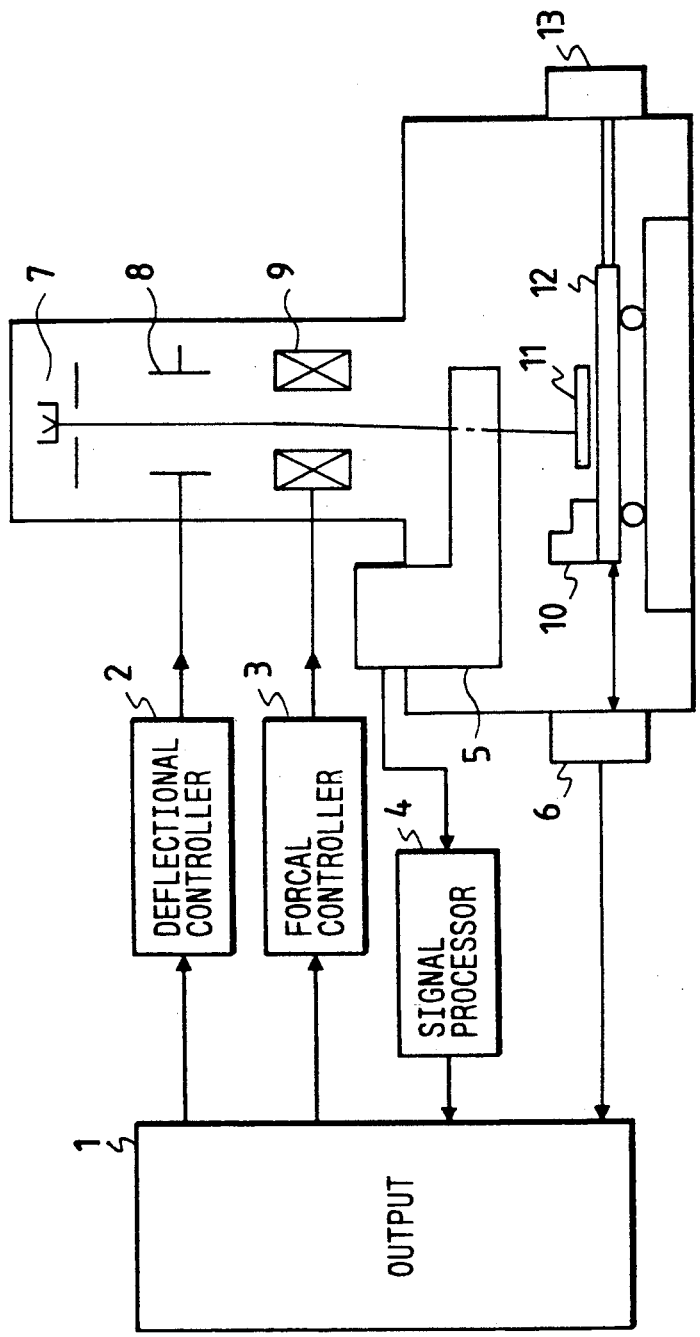
FIG. 4 is a diagrammatic view of a total construction of the electron beam lithography apparatus in the present invention.

FIG. 4 shows a diagrammatic view of a total construction of the electron beam lithography system. In this embodiment, a correcting method of electron beam in a height direction Z is shown in FIG. 5.

The electron beam irradiated from an electron gun 7 is deflected by a deflector 8 and is controlled so as to be focused on an upper surface of a specimen 11 such as a semiconductor wafer by an electron optical system 9 in order to expose upper surface of the specimen 11 installed on a stage 12 so as to form an integrated circuit on the specimen 11.

After exposing one deflection field of the upper surface, the stage 12 mounting the specimen is moved by an actuator 13 in order to expose next deflection field.

Figure 5:
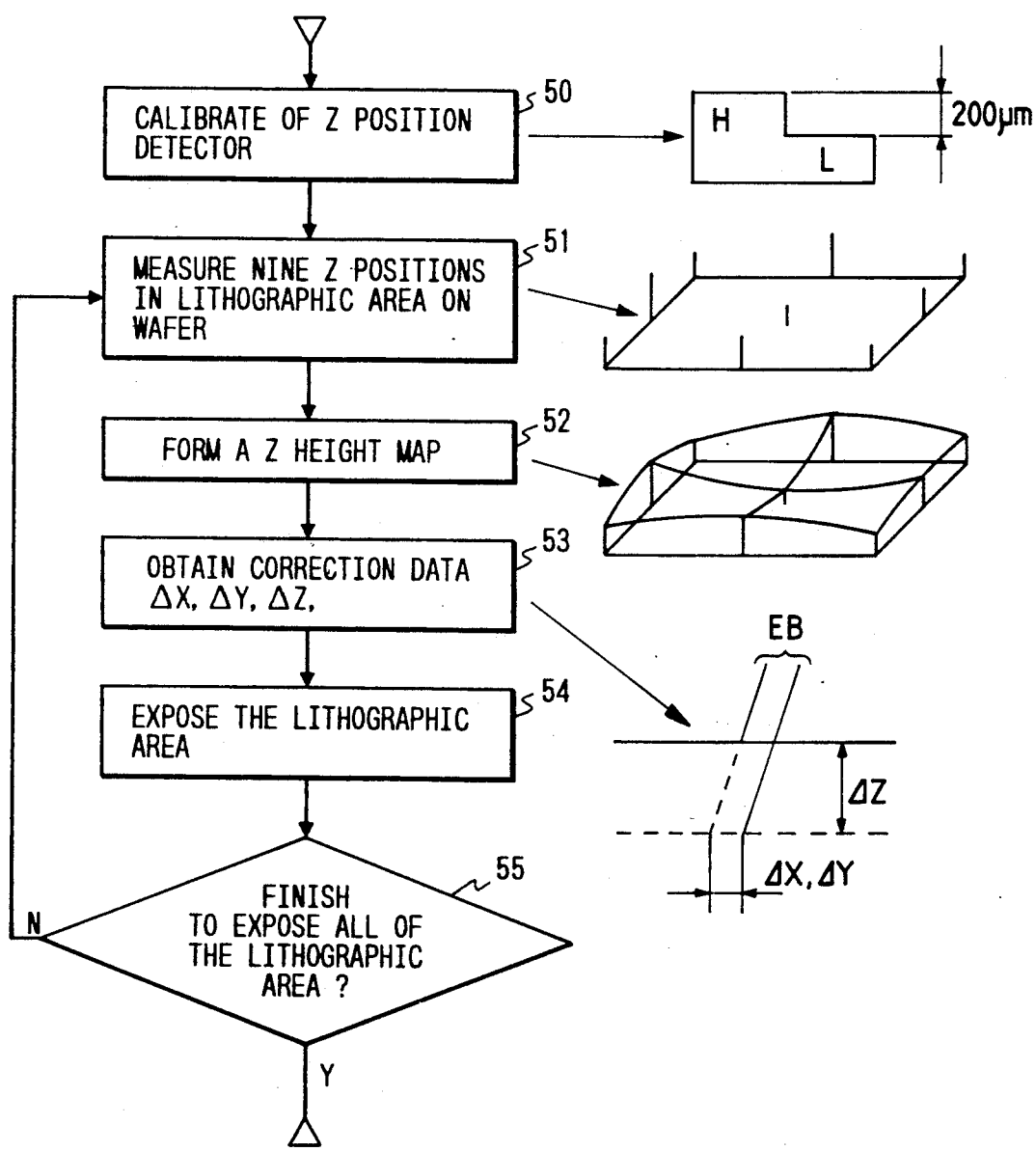
FIG. 5 is a flow chart showing a focus correction function of a computer 1 shown in the FIG. 4.

The correction in the Z direction of the electron beam is performed according to steps shown in a flow chart of FIG. 5. At first, heights of upper surfaces H and L on a standard height means 10 is measured and a height measuring means 5 for measuring the base height of the specimen 11 is calibrated(step 50). The heights of the upper surfaces H and L on the standard height means 10 shows two kinds of standard heights of the specimen 11 mounted on the stage 12 and the upper surface H is 200 $\mu$m higher than the upper surface L. Offset value and gain of the height measuring means 5 are calibrated by measuring the heights of the upper surfaces H and L.

The stage 12 is moved by an actuator 13 and the height measuring means 5 is disposed just over the standard height means 10 or specimen 11 on the stage 12 in a vacuum specimen room. A light source and a light detector of the height measuring means 5 which are not shown in the FIG. 4 are partly disposed outside of the vacuum specimen room, that is, in an atmosphere.

A detected signal from the light detector in the height measuring means 5 is converted into digital signals according to the height of the specimen 11 by a signal processor 4 so as to be read by a computer 1, be compared with a base value of the height of the specimen set in the computer 1 and calibrate the height measuring means 5.

After finishing the calibration of the height measuring means 5, the heights of nine points on the upper surface of the specimen 11 which is exposed by the electron beam, the charged perticle beam or so are measured (step 51). Based on the measured data of the heights of the nine points, a height map in the exposed area of the electron beam is obtained(step 52), and a height error $\Delta Z$ of the height from the surface L and errors $\Delta X$, $\Delta Y$ in the X, Y directions are calculated based on the height map so as to obtain correction data (step 53). The deflective controller 2 and the focal controller 3 respectively controls the deflector 8 and the electron optical system 9 based on the correction data(step 54). Until the exposure of all upper surface of the specimen finishes, the exposure in each exposing area based on the correction data is continued in the same way(step 55).

Figure 1:
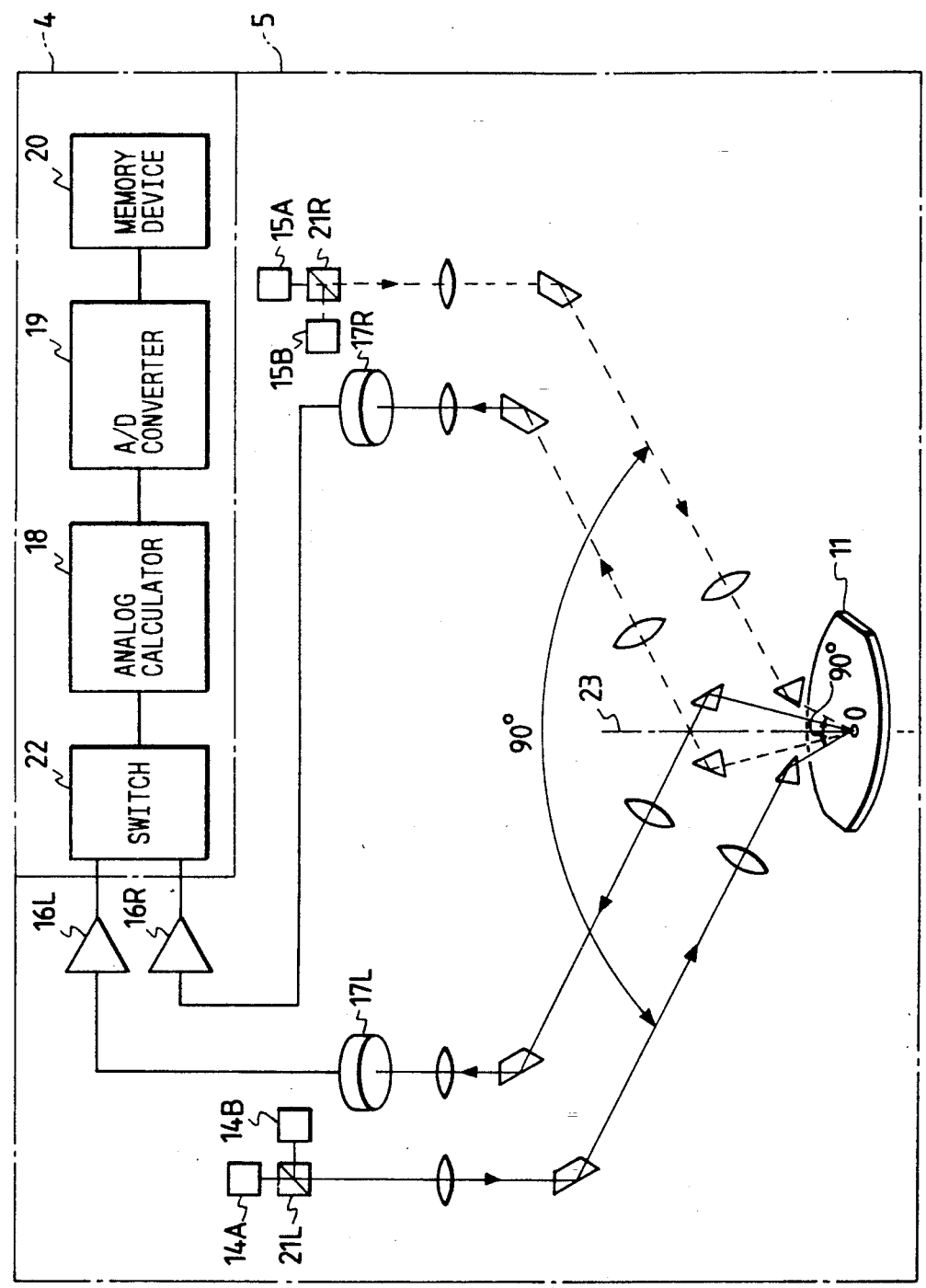
FIG. 1 is a schematic diagram of a height measuring device of the embodiment of the electron beam lithography system in the present invention.

Using FIG. 1, a practical correction method of the height of the upper surface of the specimen in the present invention will be explained as follows;

In FIG. 1, a light source 14A and an another light source 14B respectively irradiate two kind of monochromatic lights which respectively have different wave lengths each other. As the light sources 14A, 14B, laser diodes are used. The monochromatic light irradiated from the light source 14A passes through a half mirror 21L, goes along a continuous line shown in the figure and is projected onto a point O on the specimen 11.

If the height of the upper surface of the specimen is varied with the location on the specimen, the strength of the monochromatic light reflected from the point O and detected by the light detector 17L is varied and an output current from the light detector is varied too. The variation of the current is amplified by an amplifier 16L and is outputed as an voltage variation from the amplifier.

The detected voltage variation is selected by a switch 22 and is calculated by an analog calculator 18 so as to output an analog signal which is proportional to the height of the upper surface of the specimen. An analog to digital converter 19 converts the analog signal to a digital signal of the height. The digital signal is memorized in a memory device 20 and the computer 1 shown in FIG. 1 read out the digital signal from the memory device 20 and utilize the digital signal in order to obtain the correction data in the height direction Z.

As stated above, the specimen 11 is disposed in the vacuum room so as to be irradiated by electron beam and the light sources 14A and 14B are disposed in the atmosphere in order to make it easy to maintain them. The amplifier 18, the analog to digital converter 19 and the memory device 20 may be disposed in the atmosphere too.

As the monochromatic light passes from the atmosphere to the vacuum room, movable devices for the monochromatic light should not be disposed in the vacuum light pass in order to make it easy to maintain them. From this reason, the half mirror 21L which has not a movable portion is used in the vacuum as a means for mixing the monochromatic lights.

As the monochromatic lights from the light sources is transmitted through the same light pass in spite of different wavelengths of the monochromatic lights, there is a possibility that either one of the focuses of the monochromatic lights may slip off on the upper surface of the specimen. Therefore in the present invention, the positions of the light sources 14A and 14B are adjusted so as to focus both of the monochromatic lights on the same position of the upper surface of the specimen 11.

In order to cancel the interference between the two monochromatic lights in the present invention, the wavelengths $\lambda_A$, $\lambda_B$ of the two monochromatic lights are determined so as to satisfy following equation (2);

$$\lambda_B = (1 \pm \tfrac{1}{2}) \times \lambda_A \tag{2}$$

For example, in the case the wavelength $\lambda_A$ is 800 $\mu$m, the wavelength $\lambda_B$ is selected so as to be 400 $\mu$m or 1200 $\mu$m.

Furthermore in order to prevent the decreasing of the detected light strength by scattering of the light reflected from the specimen in the present invention, there is further provided a optical detecting system having light source 15A, 15B, a half mirror 21R and a light detector 17 R. The light pass of the monochromatic light irradiated from the light sources 14A, 14B projected to the point 0 of the upper surface of the specimen 11 is perpendicularly disposed from the other light pass of the monochromatic light irradiated from the light sources 15A, 15B projected to the point 0 around a vertical axis 23 which is perpendicularly stood up on the upper surface of the specimen 11. The directions of the light passes are respectively fit to X and Y direction because the patterns of the integral circuit formed on the specimen usually have long portions in X and Y direction towards which the stage 12 is moved.

In this embodiment shown FIG. 1, as two sets of the light sources 14A, 14B and 15A, 15B, the half mirrors 21L, 21R and the light detectors 17L, 17R are provided, there is no need to mechanically switch over the light passes. Both of the output signals from the light detectors 17L, 17R are respectively amplified by amplifier 16L, 16R and are supplied to the switch 22. The switch 22 switches the output signal generated from one of the amplifier 16L, 16R to the other thereof when the strength of the one of the output signal becomes below a predetermined value which are experimentally determined based on the strength of the detected light signals before.

By the way, concerning the light sources 14A, 14B, 15A, 15B, a DC source is usually provided in this embodiment, but in order to attain a long life of the light sources or an improved brightness of the light source, a pulse current sources may be provided.

One of the output signal detected by the light detectors 17L, 17R as stated above is converted into a voltage signal according to the height in the output signal by the analog calculator 18, further converted into a digital signal by the A/D converter 19 and is memorized by the memory device 20. The computer 1 calculates the correction data ΔX, ΔY, ΔZ by reading out the digital signals memorized in the memory device 20, corrects the focal controller 3 and the deflectional controller 2, and exposes the specimen 11.

In the embodiment stated above, as the heights of the upper surface of the specimen are measured by using the at least two sets of the mixed lights and further said two sets of the mixed lights are perpendicularly irradiated on the upper surface of the specimen, the specimen is exposed with a high accuracy without failing to keep a high exposure speed of the specimen.

At this time, a set of the light sources may be used commonly in stead of the two sets of the light sources shown in FIG. 1 by using a mirror which changes the light passes of the light sources from an economical point of view.

Furthermore, the switch 22 may be replaced by a adder which adds the output signals from the light detectors 17L, 17R through the amplifiers 16L, 16R. In this case, there is no need to change over the switch 22 and it is convenient in a use when the pattern on the specimen is not distinguished, but it is needed to improve the problem of the scattered light from the pattern.

Furthermore, in the embodiment shown in FIG. 1, the light passes from the two sets of the light sources 14A, 14B and 15A, 15B are perpendicularly crossed around a vertical axis 23 with an angle 90°, but the crossed angle of the light passes are not limited to 90°, that is, in the case the angles of the light passes are different each other, an improved effect to the interference caused by the photo-resist 31 is expected.

Furthermore, after either one of the light sources 14A, 14B or 15A, 15B is irradiated to the upper surface of the specimen, the one of the light sources may be changed over to the other of the light sources when the strength of the reflected light from the surface is less than a predetermined value.

We claim:

1. An electron beam lithography apparatus, comprising
an electron beam source for irradiating an electron beam on a surface of a specimen installed on a XY stage,
a deflectional controller for controlling a XY position of the electron beam on the XY stage,
a focal controller for controlling the electron beam so as to focus the electron beam on the surface of the specimen,
a light source which irradiates at least two lights on the surface, said two lights having wavelengths which are different a half of the wavelengths each other,
a signal processor for obtaining correction values in a height direction of the beam based on at least one of the lights reflected from the surface, and
a means for adjusting the focal controller according to the correction values in the height direction.

2. An electron beam lithography apparatus as defined in claim 1, wherein
said signal processor calculates obtaining correction values in XY directions and said means adjusts the deflectional controller according to the correction values in the XY directions.

3. An electron beam lithography apparatus as defined in claim 1, wherein
said light source irradiates at least two monochromatic lights.

4. An electron beam lithography apparatus as defined in claim 3, wherein
said light source irradiates the monochromatic lights which are mixed by a halfmirror.

5. An electron beam lithography apparatus as defined in claim 3, wherein
said light source emits at least two lights, one of which is selectively irradiated on the surface and is changed to the other when strength of the one is feeble.

6. An electron beam lithography apparatus as defined in claim 1, wherein
said signal processor measures a height of the surface based on at least one of the lights reflected from the surface in order to obtain the correction values in a height direction.

7. An electron beam lithography apparatus, comprising
an electron beam source for irradiating an electron beam on a surface of a specimen installed on a XY stage ,
a deflectional controller for controlling a XY position of the electron beam on the XY stage,
a focal controller for controlling the electron beam so as to focus the electron beam on the surface of the specimen,
two sets of light sources which respectively emit at least two lights and irradiate the lights on the surface in a different angle around a vertical axis which is perpendicular to the surface, said two lights respectively having wavelengths which are different a half of the wavelengths each other,
a signal processor for obtaining correction values in a height direction of the electron beam based on at least one of reflected lights from the surface which are respectively detected by two detectors, and
a means for adjusting the focal controller according to the correction values in the height direction.

8. An electron beam lithography apparatus as defined in claim 7, wherein said signal processor calculates obtaining correction values in XY directions and said means adjusts the deflectional controller according to the correction values in the XY directions.

9. An electron beam lithography apparatus as defined in claim 7, wherein
said light source irradiates at least two monochromatic lights.

10. An electron beam lithography apparatus as defined in claim 9, wherein
said light source irradiates the monochromatic lights which are mixed by a halfmirror.

11. An electron beam lithography apparatus as defined in claim 9, wherein
said light source emits at least two lights, one of which is selectively irradiated on the surface and is changed to the other when strength of the one is feeble.

12. An electron beam lithography apparatus as defined in claim 7, wherein
said signal processor obtains the correction values based on at least one of the reflected lights from the surface which is selectively detected by switching the detectors.

13. An electron beam lithography apparatus as defined in claim 7, wherein
said signal processor for obtaining correction values in a height direction of the electron beam based on a sum of the reflected lights

14. An electron beam lithography apparatus as defined in claim 7, wherein
said two sets of light sources which irradiate the lights on the surface in an angle about 90° around the vertical axis.

15. An electron beam lithography apparatus as defined in claim 7, wherein
said signal processor measures a height of the surface of the specimen based on at least one of the lights reflected from the surface in order to obtain the correction values in a height direction.

* * * * *